US011973507B2

(12) United States Patent
Leonardo

(10) Patent No.: US 11,973,507 B2
(45) Date of Patent: Apr. 30, 2024

(54) COMPARATOR CIRCUIT

(71) Applicant: ams International AG, Jona (CH)

(72) Inventor: Vincenzo Leonardo, Wädenswil (CH)

(73) Assignee: AMS INTERNATIONAL AG, Jona (CH)

( * ) Notice: Subject to any disclaimer, the term of this patent is extended or adjusted under 35 U.S.C. 154(b) by 17 days.

(21) Appl. No.: 17/924,747

(22) PCT Filed: Apr. 13, 2021

(86) PCT No.: PCT/EP2021/059548
§ 371 (c)(1),
(2) Date: Nov. 11, 2022

(87) PCT Pub. No.: WO2021/228480
PCT Pub. Date: Nov. 18, 2021

(65) Prior Publication Data
US 2023/0188126 A1  Jun. 15, 2023

(30) Foreign Application Priority Data
May 13, 2020  (EP) .................................... 20174457

(51) Int. Cl.
*H03K 5/24* (2006.01)
*H03M 1/12* (2006.01)
(52) U.S. Cl.
CPC ............... *H03K 5/24* (2013.01); *H03M 1/12* (2013.01)
(58) Field of Classification Search
CPC ...... H03K 5/24; H03K 5/2472; H03K 5/2481; H03M 1/12
(Continued)

(56) References Cited

U.S. PATENT DOCUMENTS

| 4,443,717 A | * | 4/1984 | Hague | ..................... | H03K 5/24 |
| | | | | | 327/318 |
| 4,617,473 A | * | 10/1986 | Bingham | ................ | H02J 9/061 |
| | | | | | 327/63 |

(Continued)

FOREIGN PATENT DOCUMENTS

JP    2013026837 A    2/2013

OTHER PUBLICATIONS

Rodriguez-Vazquez et al., "Trade-Offs in the Design of CMOS Comparators", C. Toumazou et al. (eds), Trade-Offs in Analog Circuit Design: The Designer's Companion, 2002, pp. 407-441.

(Continued)

*Primary Examiner* — William Hernandez
(74) *Attorney, Agent, or Firm* — MH2 TECHNOLOGY LAW GROUP LLP

(57) ABSTRACT

A comparator circuit includes an input stage with a set of differential current paths and a pair of differential input transistors connected to a pair of input terminals. An output stage includes an output current path between a first and a second supply terminal, an output transistor connected in the output current path and having a control terminal coupled to the set of differential current paths, and a comparator output connected to the output current path. An auxiliary stage includes an auxiliary current path between the supply terminals, an auxiliary current source, a first auxiliary transistor connected in the auxiliary current path and having a control terminal connected to the control terminal of the output transistor, and a voltage follower with a second auxiliary transistor and a third auxiliary transistor. The second auxiliary transistor controls the voltage follower and the third auxiliary transistor couples the control terminal of the output transistor to at least one of the set of differential current paths.

13 Claims, 4 Drawing Sheets

(58) Field of Classification Search
USPC .............................................. 327/50, 77, 89
See application file for complete search history.

(56) References Cited

U.S. PATENT DOCUMENTS

| | | | | |
|---|---|---|---|---|
| 4,835,417 | A * | 5/1989 | Kousaka | .............. H03K 5/2481 327/78 |
| 5,289,054 | A | 2/1994 | Lucas | |
| 6,020,768 | A | 2/2000 | Lim | |
| 10,505,519 | B1 | 12/2019 | Chen et al. | |
| 2010/0237907 | A1* | 9/2010 | Santoro | ................ H03K 5/2481 327/77 |
| 2018/0226961 | A1 | 8/2018 | Shimauchi et al. | |

OTHER PUBLICATIONS

Razavi et al., "Design Techniques for High-Speed, High-Resolution Comparators", IEEE Journal of Solidstate Circuits, vol. 27, No. 12, Dec. 1992, 9 pages.

Poirier, "Low Power High Speed High Accuracy Peak Comparator", 2012 International Conference on Analog VLSI Circuits AVIC2012, Oct. 24-26, 2012, 4 pages.

Holger, Kassner (EP Authorized Officer), International Search Report and Written Opinion in corresponding International Application No. PCT/EP2021/059548 dated Jul. 2, 2021, 11 pages.

\* cited by examiner

COMPARATOR CIRCUIT

CROSS-REFERENCE TO RELATED APPLICATIONS

The present application is the national stage entry of International Patent Application No. PCT/EP2021/059548, filed on Apr. 13, 2021, and published as WO 2021/228480 A1 on Nov. 18, 2021, which claims the benefit of priority of European Patent Application No. 20174457.0, filed on May 13, 2020, all of which are incorporated by reference herein in their entireties.

FIELD OF THE INVENTION

The present disclosure relates to a comparator circuit as well as to a sensor frontend and a ramp analog-to-digital converter with such a comparator circuit. The present disclosure further relates to electronic devices including such a comparator circuit.

BACKGROUND OF THE INVENTION

Comparator circuits are widely used in electronic applications. It is often desirable that the output of a comparator follows changes at its input with little delay. However, in conventional comparator circuits speed of the comparator is traded against energy consumption and/or necessary space for the circuit implementation.

SUMMARY OF THE INVENTION

An objective to be achieved is to provide an improved comparator concept that allows a fast switching of the comparator output with little current consumption.

This objective is achieved with the subject matter of the independent claims. Embodiments and developments of the improved concept are defined in the dependent claims.

A comparator circuit according to the improved comparator concept may comprise an input stage with a set of differential current paths and a pair of differential input transistors coupled with the set of differential current paths. Furthermore, the comparator circuit has an output stage with an output current path between supply terminals and an output transistor connected in the output current path and having a control terminal connected to the input stage.

The improved comparator concept is based on the idea to provide an auxiliary stage that controls the potential at the control terminal of the output transistor such that even in a tilted state of the comparator, e.g. resulting from a large difference at the input terminals of the comparator, the potential at the control terminal of the output transistor is not fully saturated but allows a quick changeover to another output state if the conditions at the input terminals are reversed. For example, this is achieved with a first auxiliary transistor in an auxiliary current path that has its control terminal connected to the control terminal of the output transistor. A voltage follower with a second auxiliary transistor and a third auxiliary transistor having control terminals connected together supports the controlling by having the second auxiliary transistor connected in the auxiliary current path while the third auxiliary transistor connects the control terminal of the output transistor to at least one current path of the set of differential current paths.

The resulting currents through the auxiliary current path and the third auxiliary transistor result in a controlled voltage drop at the control terminal of the output transistor, preventing the full saturation and allowing the output transistor and therefore the comparator output to switch immediately once the sensing input crosses the threshold voltage of the comparator. The auxiliary stage therefore regulates the comparator's internal node, which in conventional solutions needs to recover from a saturation state to a well-defined level near the point at which the comparator would switch.

For example, an embodiment of a comparator circuit according to the improved comparator concept comprises an input stage comprising a set of differential current paths and a pair of differential input transistors coupled with the set of differential current paths and having control terminals connected to a pair of input terminals of the comparator circuit. An output stage comprises an output current path between a first and a second supply terminal, an output transistor connected in the output current path and having a control terminal connected to one current path of the set of differential current paths, and a comparator output connected to the output current path.

The auxiliary stage comprises an auxiliary current path between the first and the second supply terminal, an auxiliary current source connected in the auxiliary current path, a first auxiliary transistor connected in the auxiliary current path and having a control terminal connected to the control terminal of the output transistor, and a voltage follower with a second auxiliary transistor and a third auxiliary transistor having control terminals connected together. The second auxiliary transistor is connected in the auxiliary current path and controls the voltage follower. The third auxiliary transistor couples the control terminal of the output transistor to at least one current path of the set of differential current paths.

The auxiliary current source in the auxiliary stage forces a specified current to flow through the auxiliary current path and therefore through the first and the second auxiliary transistor. Due to the voltage follower configuration between the second and the third auxiliary transistor, a certain current flow is also implied through the third auxiliary transistor, i.e. from the control terminal of the output transistor, respectively the first auxiliary transistor, to the input stage of the comparator. As these current flows are determined by the respective control voltages of the three auxiliary transistors, it follows that a certain potential at the control terminal of the first auxiliary transistor, which is connected to the output transistor, is regulated this way.

In particular, such regulation brings the potential at the control terminals of the first auxiliary transistor and the output transistor closer to a switching point of the output transistor and at the same time away from a saturated potential. Hence, if the conditions at the input terminals change towards an equilibrium or a changeover, the output transistor can switch over faster.

For example, the first, the second and the third auxiliary transistors are dimensioned such that at the operating point of the auxiliary stage a voltage difference between a source terminal and the control terminal of the first auxiliary transistor is greater than zero and lower than a threshold voltage difference of the output transistor. The threshold voltage difference may be defined as the threshold for switching between two output states at an equilibrium of the comparator, i.e. when there is zero voltage difference between the input terminals of the comparator. The voltage difference between the source terminal and the control terminal of the first auxiliary transistor may be an absolute voltage difference, depending on the transistor type. Such dimensioning can be achieved in various ways. For example, the auxiliary transistors can be dimensioned such that a current density of the first auxiliary transistor is lower than a current density of the output transistor. Furthermore, it is also possible that a current density of the second auxiliary transistor is lower than a current density of the third auxiliary transistor. Also a combination of the above two is possible.

In another type of dimensioning, a threshold voltage of the first auxiliary transistor is lower than a threshold voltage of the output transistor and/or a threshold voltage of the second auxiliary transistor is lower than a threshold voltage of the third auxiliary transistor.

In these configurations it may be assumed that the source terminals of the first auxiliary transistor and the output transistor are at the same potential or a similar potential, e.g. one of the supply terminals. It should further be noted that the mentioned regulation of the potential at the control terminal of the output transistor is also achieved by reusing the current provided from the differential current path of the input stage and back to the input stage. Furthermore, the regulation is only active when the comparator is in the tilted state and does not require the full performance of the differential input pair. This allows a power efficient implementation of the improved comparator concept. Once the two input voltages approach one another, respectively, i.e. when the comparator is supposed to switch, the regulation turns off automatically due to the changes at the control terminals of the output transistor and the first auxiliary transistor induced by the input stage.

In some implementations of the comparator circuit, the set of differential current paths of the input stage contains a current mirror with a differential transistor pair. The one current path of the set of differential current paths being connected to the control terminal of the output transistor is controlled by the current mirror. This means, for example, that a potential transferred from the input stage to the output transistor is not controlled actively in the respective current path but only by the current mirror controlled from the other current path of the differential current path. This allows easier control of the respective node.

In some implementations the set of differential current paths of the input stage contains the pair of differential input transistors and a current mirror with a differential transistor pair. The input stage comprises an input current source that has a common connection with the set of differential current paths of the input stage. The third auxiliary transistor is connected between the control terminal of the output transistor and the common connection with the input current source. Also in such a configuration the one current path of the set of differential current paths being connected to the control terminal of the output transistor may be controlled by the current mirror. The feedback of the current from the control terminal of the output transistor to the common connection of the set of differential current paths through the third auxiliary transistor particularly allows efficient reuse of the current provided from the input stage, in particular the current mirror, to the output stage.

In an alternative implementation, the input stage is implemented as a folded cascode. The pair of differential input transistors is coupled between a common current source and the set of different current paths. The set of differential current paths is coupled between the first and the second supply terminal and comprises a current mirror with a different transistor pair. Such a configuration also allows efficient current reuse of the current provided from the control terminal of the output transistor.

Various other modifications are possible for the implementation of the input stage. However, the auxiliary stage may still provide efficient regulation of the potential of the control terminal of the output transistor while saving power via the current reusage.

The comparator circuit according to the implementations described above may be particularly useful if a varying voltage has to be compared to a fixed or changing reference voltage. In particular, the comparator can be used to detect whether the sense voltage exceeds the reference voltage with a fast reaction time.

For example, a comparator circuit according to one of the embodiments described above can be used in a sensor frontend for a photodiode that comprises an integrator for integrating a photocurrent from the photodiode. In such a configuration the comparator circuit has a first embodiment of the pair of input terminals connected to an output of the integrator and a second terminal of the pair of input terminals connected to a reference voltage source. Hence, crossings of the integrated photocurrent with a reference voltage can be detected in a fast manner.

In another implementation a comparator circuit according to the improved comparator concept can be used in a ramp analog-to-digital converter, ADC. For example, a first terminal of the pair of input terminals is connected to an output of a ramp signal generator, a second terminal of the pair of input terminals is connected to a sample-and-hold element sampling an input signal provided at an input terminal, and the comparator output is coupled to a counter circuit for providing a digital output value corresponding to the input signal.

The various implementations of comparator circuits, sensor frontends and ramp ADCs can for example be used in various stationary or portable electronic devices. Examples for stationary electronic devices are medical imaging devices like X-ray apparatuses or computed tomography devices. Examples for portable electronic devices are smartphones, wearables like smartwatches or biosensors, portable sensor devices or the like, e.g. for optical sensor applications. The improved comparator concept therefore also encompasses such electronic devices.

BRIEF DESCRIPTION OF THE DRAWINGS

The improved comparator concept will be described in more detail in the following with the aid of drawings. Elements having the same or similar function bear the same reference numerals throughout the drawings. Hence their description is not necessarily repeated in following drawings.

In the drawings.

DETAILED DESCRIPTION

Figure 1:
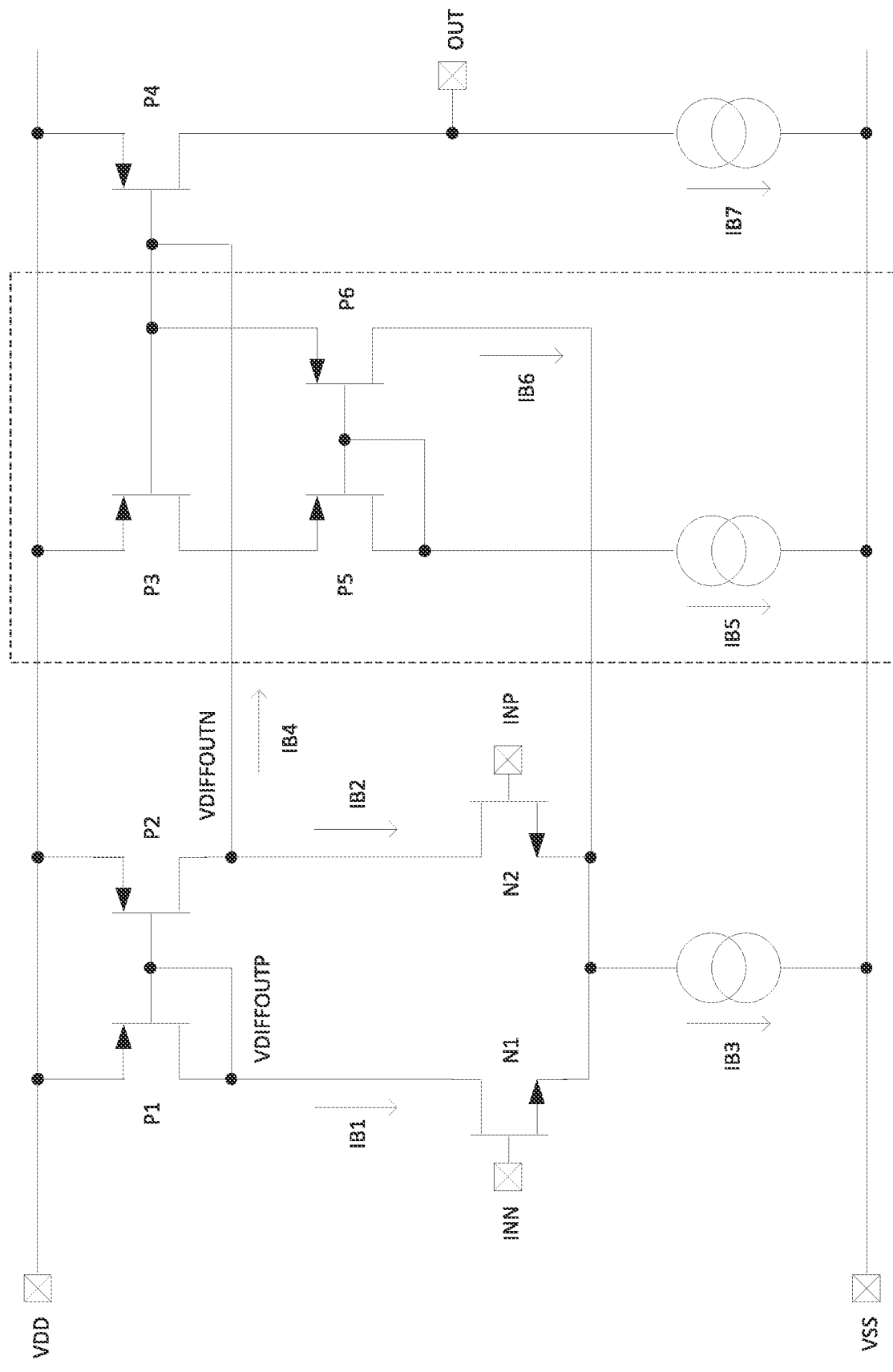
FIG. 1 shows an example implementation of a comparator circuit.

FIG. 1 shows a first example implementation of a comparator circuit according to the improved comparator concept. In this example implementation the comparator circuit is formed from three stages, in particular an input stage, an output stage and an auxiliary stage. All stages are connected between a first and a second supply terminal VDD, VSS. For example, the first supply terminal VDD provides a positive supply voltage and the second supply terminal VSS provides a negative supply voltage or a ground potential.

The input stage comprises a set of differential current paths and a pair of differential input transistors N1, N2 that are coupled in the set of differential current paths. In particular, the controlled section, e.g. the source-drain connection, of each of the input transistors N1, N2 is connected in each one of the differential current paths. Control terminals or gate terminals of the input transistors N1, N2 are respectively connected to a pair of input terminals INN, INP of the comparator circuit. In this example implementation the input transistors N1, N2 have a common connection to an input current source that is coupled to the second supply terminal VSS. In particular, the source terminals of the input transistors N1, N2 are connected to this input current source.

The set of differential current paths of the input stage further comprises a current mirror with a differential transistor pair P1, P2, from which transistor P1 controls the current mirror. Accordingly, a current IB1 flowing through transistors P1 and N1 controls the current through transistor P2. Said current through transistor P2 splits up into a current IB2 flowing through transistor N2 and a current IB4 flowing to the output stage.

The output stage comprises an output current path between the first and the second supply terminal VDD, VSS, an output transistor P4 connected in the output current path and having a control terminal or gate terminal connected to the drain terminal of transistor P2 in the input stage. The output stage further comprises an output current source driving a current IB7. A comparator output OUT is coupled to a node in the output current path between the output transistor P4 and the output current source.

According to the improved comparator concept, the comparator circuit further comprises an auxiliary stage being enclosed in the dashed box. The auxiliary stage comprises an auxiliary current path between the first and the second supply terminal VDD, VSS. In the auxiliary current path, a first auxiliary transistor P3 is connected having its control terminal or gate terminal connected to the control terminal of the output transistor P4. Both the first auxiliary transistor P3 and the output transistor P4 have their source terminal connected to the first supply terminal VDD. The auxiliary stage further comprises a voltage follower formed of transistors P5 and P6, from which transistor P5 is connected in the auxiliary current path and controls the voltage follower. To this end transistor P5 is diode-connected, i.e. has its control terminal connected to its drain terminal. To perform the voltage follower function, the control terminal of transistor P6 is connected to the control terminal of transistor P5. A controlled section of transistor P6 is connected between the control terminal of the output transistor P4 and the common connection of the input transistors N1, N2 with the input current source. The auxiliary current path further comprises a current source driving current IB5 and having one end connected to the second supply terminal VSS and the other end connected to the drain terminal of transistor P5. A current IB6 flows through the third auxiliary transistor P6.

During operation of the comparator circuit, the input terminal INN is for example the negative input or inverting input of the comparator, to which a reference voltage can be provided defining the threshold voltage of the comparator. Therefore, when an input voltage at the positive input or non-inverting input INP is higher than the reference voltage, the output OUT of the comparator will be high, corresponding e.g. to the potential at the first supply terminal VDD, otherwise low, corresponding to the potential at the second supply terminal VSS.

Assuming operation of the comparator circuit without the auxiliary stage, when the potential at the input terminal INP is lower than the potential at input terminal INN, the output of the differential pair, i.e. the connection to the output stage having the potential VDIFFOUTN, would normally, i.e. without applying the improved comparator concept, be identical or close to the upper rail defined by the first supply terminal VDD. If the voltage at the input terminal INP rises up to the potential of input terminal INN quickly, the node VDIFFOUTN needs to settle back to its operating point, which is roughly at one threshold voltage below the supply voltage at first supply terminal VDD, or the gate source voltage of the output transistor P4. Without the improved comparator concept this recovery phase happens in a slewing manner, slowing down the speed of the comparator.

The improved comparator concept prevents the node VDIFFOUTN from going to the upper rail by limiting its excursion by means of a regulation loop formed by the auxiliary transistors P3, P5 and P6. Hence, instead of recovering from the potential at the upper rail, the node VDIFFOUTN will settle back to its operating point from a voltage level which is slightly above the final operating point, resulting in a much faster settling.

This is, for example, achieved by dimensioning the first, the second and the third auxiliary transistor P3, P5, P6 such that at an operating point of the auxiliary stage a voltage difference between the source terminal and the control terminal of the first auxiliary transistor P3 is greater than zero and lower than a threshold voltage difference of the output transistor P4. Such a threshold voltage difference of the output transistor P4 may be defined as the voltage difference at which the output transistor P4 switches from a non-conducting state to a conducting state corresponding to a switching from a low level to a high level at the comparator output OUT. This can, for example, be achieved by dimensioning a threshold voltage of the first auxiliary transistor P3 being lower than the threshold voltage of the output transistor.

For example, the dimensioning can be achieved by having the first auxiliary transistor P3 generally matched with the output transistor P4 and acting as a reference transistor for defining the upper limit voltage of the node VDIFFOUTN. For example, by selecting a lower current density of transistor P3 with respect to transistor P4, the auxiliary transistor P3 will need a smaller gate source voltage resulting in a higher voltage at node VDIFFOUTN compared to the operating point of the output transistor P4 at a differential input voltage at the input terminals INP, INN of 0 V.

The first auxiliary transistor P3 forms a general amplifier along with the auxiliary current source driving current IB5 and therefore provides gain. As mentioned above, the second and third auxiliary transistors P5 and P6 form a voltage follower or source follower output of the general amplifier. The source terminal of the third auxiliary transistor P6 is the output of the voltage follower which regulates the voltage at node VDIFFOUTN when a voltage at input terminal INP is lower than at input terminal INN.

In an alternative implementation, dimensioning of the auxiliary transistors is made such that a threshold voltage of the second auxiliary transistor P5 is lower than a threshold voltage of the third auxiliary transistor. Furthermore, the dimensioning of the threshold voltages of transistors P3 and P4 can be combined with the dimensioning of auxiliary transistors P5 and P6.

Similarly, a current density of the second auxiliary transistor P5 can be dimensioned to be lower than a current density of the third auxiliary transistor P6.

By way of the dependencies between the respective gate-source voltages of the auxiliary transistors P3, P5 and P6 and the respective current flowing through these transistors, regulation of the potential at the node VDIFFOUTN is established.

The third auxiliary transistor P6 sinks the current IB6 needed to pull down the voltage at node VDIFFOUTN to the tail of the differential input pair N1, N2. This leads to an equalization of the currents of the differential pairs N1, N2.

For example, in the tilted situation where the voltage at the positive input terminal INP is lower than the voltage at the negative input terminal INN, the whole current IB3 would flow down from IB1 if the auxiliary stage was not present. However, due to the presence of the auxiliary stage the current IB6 needed to pull down the voltage at node VDIFFOUTN to the defined level will be sinked to the current source providing current IB3. This means that roughly half of the current IB3 will flow down from IB1 while the other half is provided by current IB6. This pre-biases the input stage of the comparator circuit to a configuration close to the switching point, except for the input transistor N2, which continuously senses the voltage at the positive input terminal INP. This prepares the differential pair N1, N2 to switch quickly once the differential input voltage at the input terminals INP, INN becomes 0 V.

Once the differential input voltage of the comparator becomes 0 V, the auxiliary stage will not act anymore and the regulation of the auxiliary stage disables itself, letting the comparator circuit switch with its normal accuracy.

The auxiliary stage according to the improved comparator concept adds one additional current branch to an existing comparator circuit having an input stage and an output stage as described. The gain speed performance allows to compensate at least for the additional current branch resulting in a power efficient solution.

Since the slewing prevention is done by regulation, the resulting accuracy and stability of the performance across process variations and ambient temperature is well-controlled.

The regulation shares the biasing current provided by the input current source connected to the pair of differential input transistors. This ensures power efficient and high speed properties without affecting the accuracy of the comparator. In particular, this is achieved by sharing the current with the pair of differential input transistors N1, N2 when the comparator is in a tilted state and when the accuracy is not important. Beside one additional current branch, namely the auxiliary current path, there is no additional current consumption required to boost the speed.

The auxiliary stage is power efficient, fast and does not affect the accuracy of the comparator. Since the additional circuitry of the auxiliary stage is relatively small, it is also suitable for multi-channel devices where the area is critical for each block being present in every channel.

Figure 2:
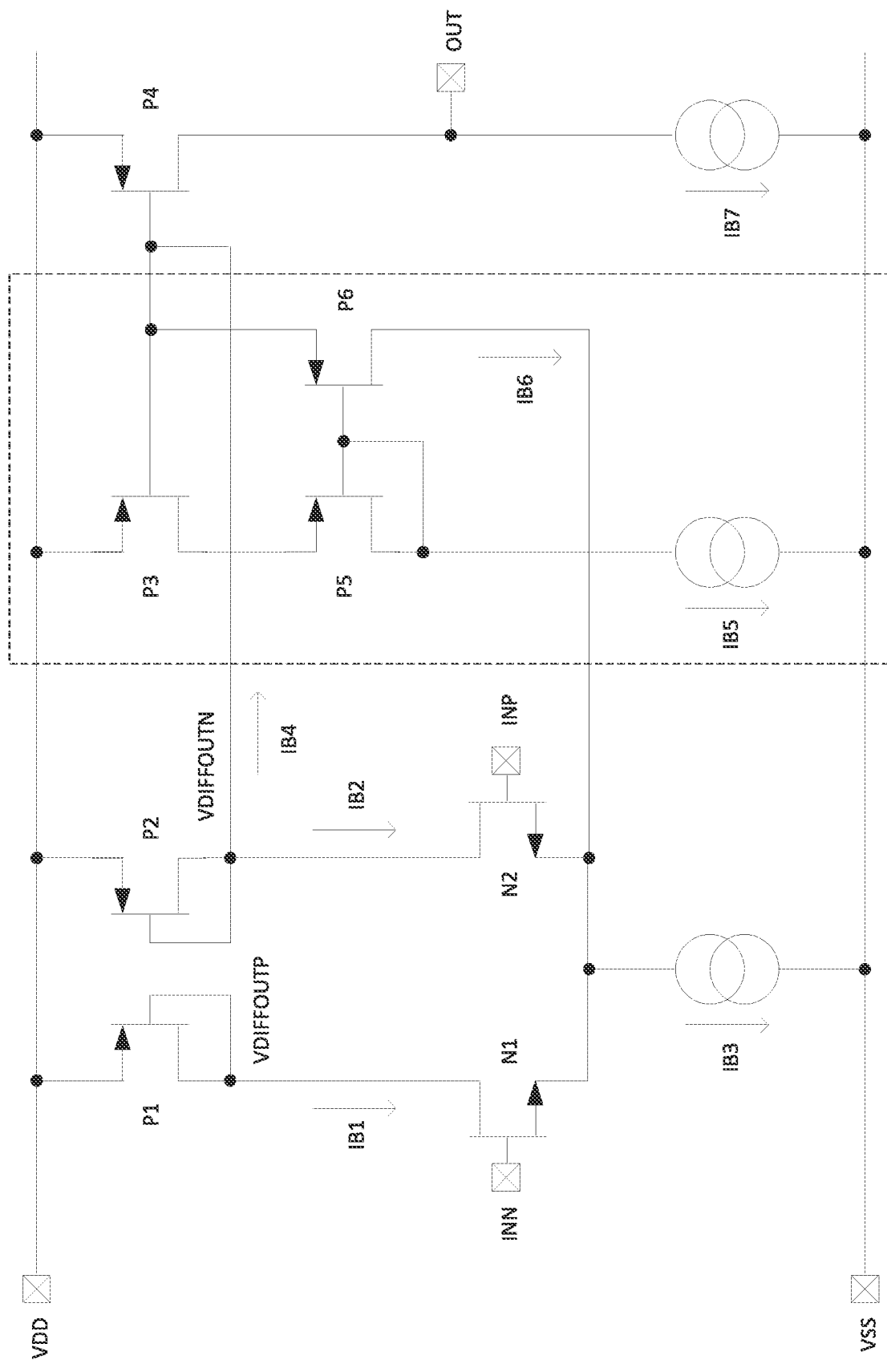
FIG. 2 shows a further example implementation of a comparator circuit.

FIG. 2 shows an alternative implementation of a comparator circuit according to the improved component concept, which is based on the implementation shown in FIG. 1. Accordingly, only differences to the implementation of FIG. 1 will be explained.

Instead of a current mirror in the input stage, the input stage of the implementation of FIG. 2 comprises two diode-connected transistors P1, P2 in each current path of the differential current paths of the input stage. Despite the fact that the current branch with transistor P2 is not controlled by P1, the voltage at the node VDIFFOUTN still tends to stick to the upper rail, assuming that the auxiliary stage is not present. Hence, without the auxiliary stage the potential at the control terminal of output transistor P4 would need to recover from such a voltage once the voltage at the positive input terminal INP approaches the voltage at the negative input INN resulting in a switching of the comparator output OUT.

However, with the auxiliary stage being present, the same effects as described in conjunction with FIG. 1 occur, therefore speeding up a switching at the comparator output OUT.

For both the implementations of FIG. 1 and FIG. 2, additional transistor pairs or single transistors may be present in the various current paths, for example for biasing reasons or the like, which however do not influence the general principle described in conjunction with the improved comparator concept. In any case, the voltage at the control terminal of the output transistor P4 is brought to a level that is close to a switching threshold of the output transistor P4.

Figure 3:
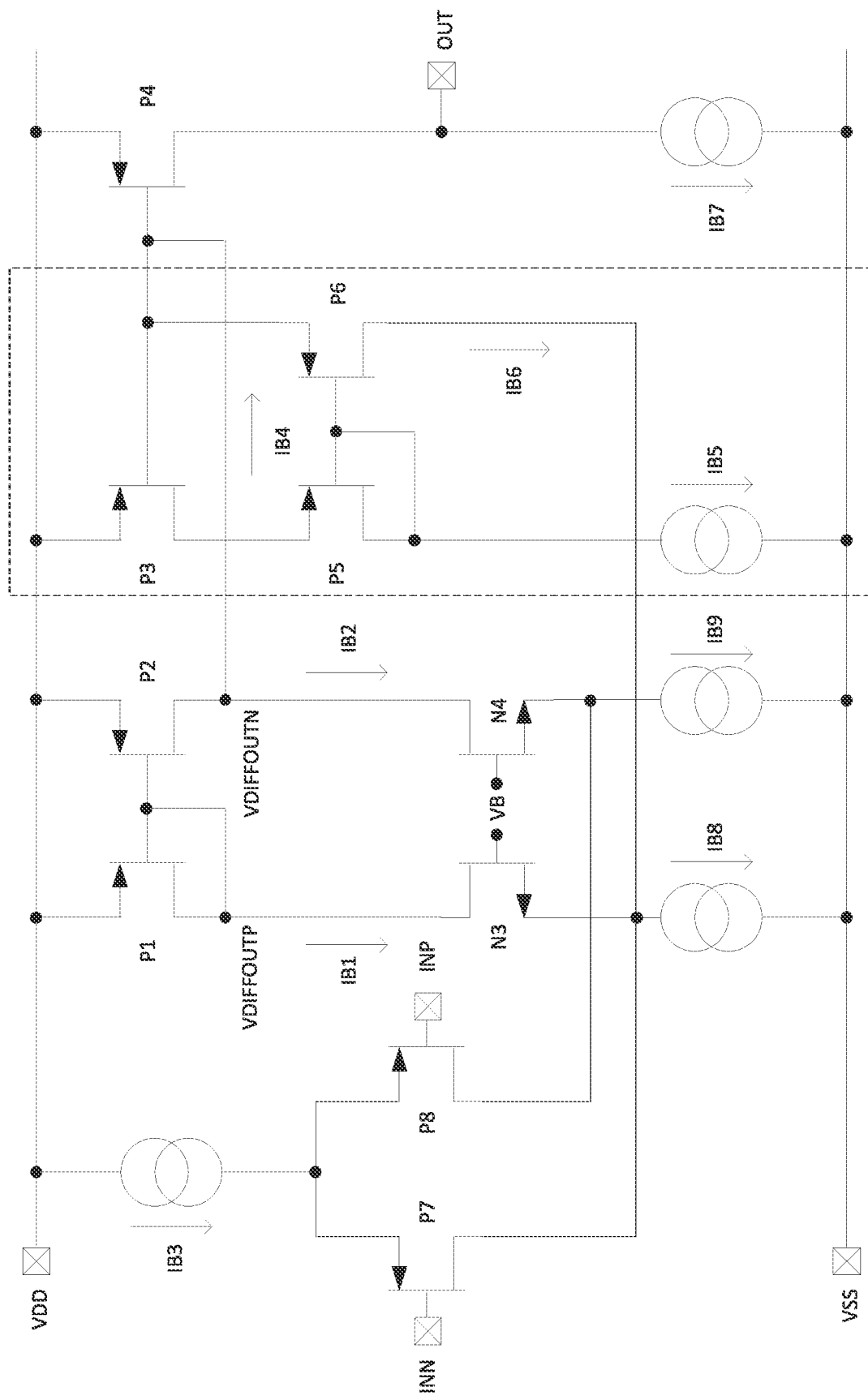
FIG. 3 shows a further example implementation of a comparator circuit.

FIG. 3 shows another example implementation of a comparator circuit according to the improved comparator concept. The output stage and the auxiliary stage are similar to the respective implementations in FIG. 1 and FIG. 2. In this implementation the input stage is implemented as a folded cascode with a set of differential paths comprising a current mirror with transistors P1, P2, which is similar to the implementation of FIG. 1. Furthermore, the differential current path comprises a pair of biasing transistors N3, N4 controlled by a bias voltage VB. Each path of the differential current paths includes a respective current source driving currents IB8, IB9 and coupling the differential current paths to the second supply terminal VSS. The pair of input transistors is formed by transistors P7, P8 being connected to the first supply terminal by an input current source driving current IB3. Drain terminals of the input transistors P7, P8 are respectively connected to each one of the differential current paths. In particular, transistor P7 is connected to the current path with transistors P1 and N3 with the current source driving current IB8, and transistor P8 is connected to the current path comprising transistors P2, N4 and the current source driving current IB9. The feedback from the auxiliary stage via transistor P6 is connected to the common connection of transistors P7, N3.

With such an implementation of the input stage, a similar situation as with the implementation of FIG. 1 occurs in the tilted state without the presence of the auxiliary stage. In particular, if the voltage at the positive input terminal INP is below the voltage at the negative input INN, the current IB3 provided by the input current source would completely or almost completely flow through input transistor P8, while no or nearly no current would flow through input transistor P7. Hence, the current IB1 through transistor P1 would have to provide the full current IB8. Consequently, mirror transistor P2 would also be controlled to an open state, resulting in the voltage at the node VDIFFOUTN being at the potential or close to the potential of the first supply terminal VDD. Furthermore, in this state also the control terminal of output transistor P4 would be close to the upper rail.

With the auxiliary stage, which acts as described in conjunction with FIG. 1, the potential at the control terminal of output transistor P4 will be regulated such that a voltage difference between the source terminal and the control terminal of the first auxiliary transistor P3 is greater than 0 and lower than the threshold voltage difference of the output transistor P4. This reduces slewing effects if the comparator circuit is about to switch.

As input transistor P7 provides no current, the current IB8 is a sum of currents IB1 and IB6. With the feedback of this current IB6 from the auxiliary stage, IB1 is reduced with respect to an implementation without the auxiliary stage. Hence, the current IB6 is efficiently reused. Further implementations of the input stage and/or variations in the output stage are still possible. In any case, the auxiliary stage reduces slewing of the output transistor.

A comparator circuit according to the improved comparator concept can be used in various applications where comparators with a fast detection are desired.

Figure 4:
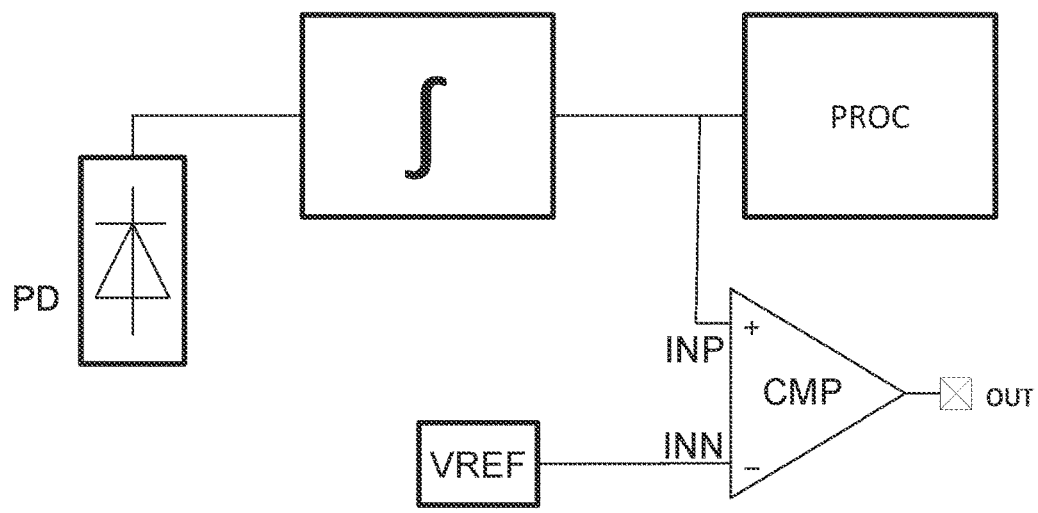
FIG. 4 shows an example implementation of a sensor frontend for a photodiode.

For example, FIG. 4 shows an example implementation of a sensor frontend for a photodiode PD. For example, the sensor frontend comprises an integrator that can be coupled to the photodiode PD for integrating its photocurrent. An output of the integrator is coupled to a processing circuit which may process the integrated signal in the analog or digital domain. Furthermore, the output of the integrator is connected to a non-inverting, positive input INP of a comparator that is implemented according to one of the examples described above. The negative, inverting input is connected to a reference voltage source VREF, which can be a constant voltage source or a varying voltage source.

At the beginning of an integration cycle, the output of the integrator is below the reference voltage. However, as soon as the integrated photocurrent, i.e. the voltage provided by the integrator, exceeds the level of the reference voltage, the comparator circuit CMP can indicate this crossing with little delay at the comparator output OUT. For example, this information can be used in the processing circuit PROC.

Figure 5:
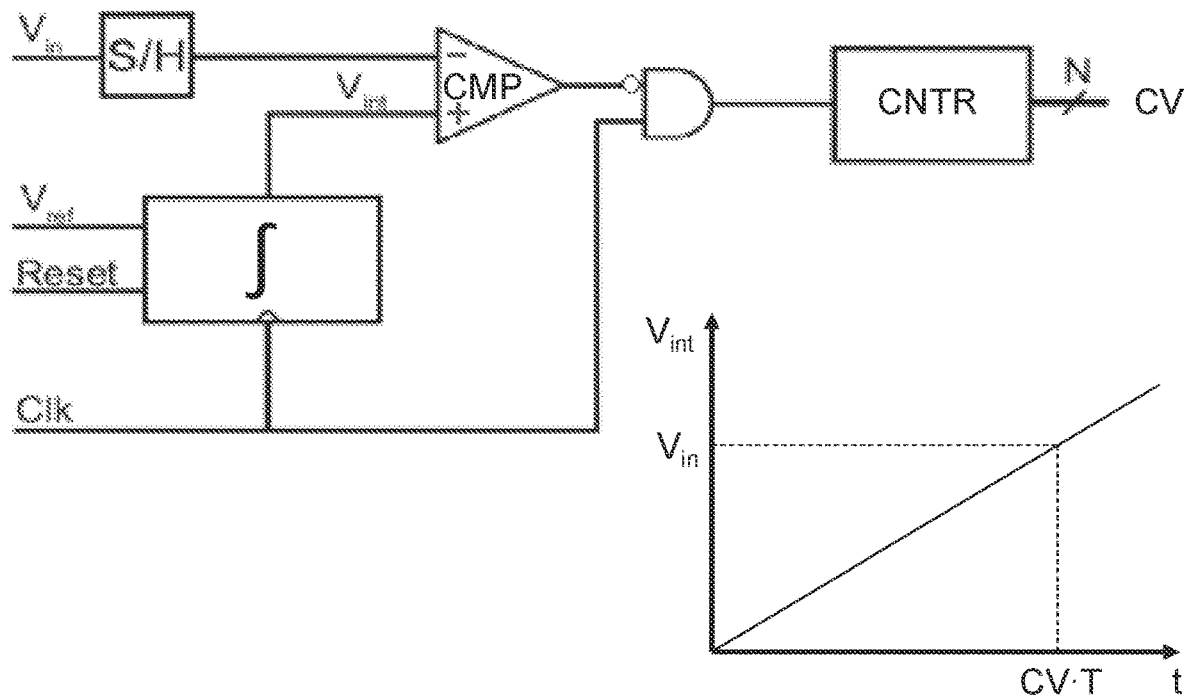
FIG. 5 shows an example implementation of a ramp analog-to-digital converter.

FIG. 5 shows another application of the comparator circuit within a ramp analog-to-digital converter, ADC. In this application a first terminal, in particular the non-inverting input of the comparator CMP is connected to an output of a ramp signal generator. The second input, the inverting input, is connected to a sample-and-hold element S/H sampling an input signal VIN provided at an input terminal.

The ramp signal generator is formed, for example, by an integrator integrating a constant reference voltage, such that a linear ramp voltage VINT is output. The integrator can be reset by a respective signal and based on a clock signal CLK.

At the beginning of each ramp cycle the ramp signal VINT will be below the input voltage VIN at the inverting input INN. Once the ramp signal VINT crosses that level, the comparator output will switch accordingly from low to high. In other words, before that crossing the output is low. The ramp ADC further comprises an AND gate having a first input provided with the clock signal CLK and the second input with an inverted version of the comparator output. Hence, with every clock edge before the crossing with the ramp signal VINT, a pulse is provided to a counter CNTR, which counts the respective pulses accordingly. Once the input voltage VIN is crossed by the ramp signal VINT, the AND gate does not provide any pulses, such that a counter value CV of the counter CNT remains constant. The counter value may be implemented with an N-bit word representing the digital equivalence of the input signal VIN.

As shown in the signal diagram, the input voltage VIN corresponds to the voltage of the ramp signal VINT after a given time t that is defined by the counter value CV times a clock period T of the clock signal CLK, i.e. CV·T. Although in the example implementations the transistors have been shown to be either of a p-channel type or an n-channel type, the respective transistor types could be also all changed to the opposite type together with a switching of the polarity of the supply potentials and supply terminals VDD, VSS. Such an alternative implementation is therefore also covered by the present disclosure and the scope as defined within the claims.

The various implementations of comparator circuits, sensor frontends and ramp ADCs can for example be used in various stationary or portable electronic devices, e.g. stationary electronic devices like medical imaging devices like X-ray apparatuses or computed tomography devices, or portable electronic devices like smartphones, wearables like smartwatches or biosensors, portable sensor devices or the like, e.g. for optical sensor applications.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art and fall within the spirit of the appended claims. The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

The invention claimed is:

1. A comparator circuit comprising
an input stage comprising a set of differential current paths and a pair of differential input transistors coupled with the set of differential current paths and having control terminals connected to a pair of input terminals of the comparator circuit;
an output stage comprising an output current path between a first and a second supply terminal, an output transistor connected in the output current path and having a control terminal connected to one current path of the set of differential current paths, and a comparator output connected to the output current path; and
an auxiliary stage comprising an auxiliary current path between the first and the second supply terminal, an auxiliary current source connected in the auxiliary current path, a first auxiliary transistor connected in the auxiliary current path and having a control terminal connected to the control terminal of the output transistor, and a voltage follower with a second auxiliary transistor and a third auxiliary transistor (P6) having control terminals connected together, wherein the second auxiliary transistor is connected in the auxiliary current path and controls the voltage follower and wherein the third auxiliary transistor couples the control terminal of the output transistor to at least one current path of the set of differential current paths.

2. The comparator circuit according to claim 1, wherein the first, the second and the third auxiliary transistor are dimensioned such that at an operating point of the auxiliary stage a voltage difference, in particular an absolute voltage difference, between a source terminal and the control terminal of the first auxiliary transistor is greater than zero and lower than a threshold voltage difference of the output transistor.

3. The comparator circuit according to claim 2, wherein a current density of the first auxiliary transistor is lower than a current density of the output transistor and/or a current density of the second auxiliary transistor is lower than a current density of the third auxiliary transistor.

4. The comparator circuit according to claim 2, wherein a threshold voltage of the first auxiliary transistor is lower than a threshold voltage of the output transistor and/or a threshold voltage of the second auxiliary transistor is lower than a threshold voltage of the third auxiliary transistor.

5. The comparator circuit according to claim 1, wherein
the set of differential current paths of the input stage contains a current mirror with a differential transistor pair; and
the one current path of the set of differential current paths being connected to the control terminal of the output transistor is controlled by the current mirror.

6. The comparator circuit according to claim 1, wherein
the set of differential current paths of the input stage contains the pair of differential input transistors and a current mirror with a differential transistor pair;
the input stage comprises an input current source that has a common connection with the set of differential current paths of the input stage; and
the third auxiliary transistor is connected between the control terminal of the output transistor and the common connection with the input current source.

7. The comparator circuit according to claim 1, wherein
the set of differential current paths of the input stage contains the pair of differential input transistors and a differential transistor pair;
the input stage comprises an input current source that has a common connection with the set of differential current paths of the input stage; and
the third auxiliary transistor is connected between the control terminal of the output transistor and the common connection with the input current source.

8. The comparator circuit according to claim 7, wherein each transistor of the differential transistor pair is implemented in a diode-connected fashion.

9. The comparator circuit according to claim 1, wherein
the input stage is implemented as a folded cascode;
the pair of differential input transistors is coupled between a common current source and the set of differential current paths; and
the set of differential current paths is coupled between the first and the second supply terminal and comprises a current mirror with a differential transistor pair.

10. A sensor frontend for a photodiode, the sensor frontend comprising
an integrator for integrating a photocurrent from the photodiode; and
a comparator circuit according to claim 1 having a first terminal of the pair of input terminals connected to an output of the integrator and a second terminal of the pair of input terminals connected to a reference voltage source.

11. A ramp analog-to-digital converter, ADC, comprising a comparator circuit according to claim 1, wherein
a first terminal of the pair of input terminals is connected to an output of a ramp signal generator;
a second terminal of the pair of input terminals is connected to a sample-and-hold element sampling an input signal provided at an input terminal; and
the comparator output is coupled to a counter circuit for providing a digital output value corresponding to the input signal.

12. An electronic device comprising:
a comparator circuit according to claim 1;
a sensor frontend comprising an integrator for integrating a photocurrent from a photodiode; and
a ramp analog-to-digital converter wherein
a first terminal of a pair of input terminals is connected to an output of a ramp signal generator;
a second terminal of the pair of input terminals is connected to a sample-and-hold element sampling an input signal provided at an input terminal; and
the comparator output is coupled to a counter circuit for providing a digital output value corresponding to the input signal.

13. The electronic device according to claim 12, wherein the electronic device is implemented as one of the following:
a stationary electronic device;
an X-ray apparatus;
a computed tomography device;
a portable electronic device;
a smartphone;
a wearable device, in particular smartwatch or biosensor; or
a portable sensor device.

* * * * *